(12) United States Patent  
Jongman et al.

(10) Patent No.: US 9,911,854 B2  
(45) Date of Patent: Mar. 6, 2018

(54) SOURCE/DRAIN CONDUCTORS FOR TRANSISTOR DEVICES

(71) Applicant: FLEXENABLE LIMITED, Cambridge (GB)

(72) Inventors: Jon Jongman, Cambridge (GB); Brian Asplin, Cambridge (GB)

(73) Assignee: FLEXENABLE LIMITED, Cambridge (GB)

( * ) Notice: Subject to any disclaimer, the term of this patent is extended or adjusted under 35 U.S.C. 154(b) by 0 days.

(21) Appl. No.: 15/039,126

(22) PCT Filed: Dec. 9, 2014

(86) PCT No.: PCT/EP2014/077087  
§ 371 (c)(1),  
(2) Date: May 25, 2016

(87) PCT Pub. No.: WO2015/086621  
PCT Pub. Date: Jun. 18, 2015

(65) Prior Publication Data  
US 2017/0213915 A1 Jul. 27, 2017

(30) Foreign Application Priority Data  
Dec. 10, 2013 (GB) .................................. 1321796.3

(51) Int. Cl.  
*H01L 29/78* (2006.01)  
*H01L 29/786* (2006.01)  
(Continued)

(52) U.S. Cl.  
CPC .... *H01L 29/78618* (2013.01); *H01L 27/1225* (2013.01); *H01L 27/1288* (2013.01); *H01L 29/66969* (2013.01); *H01L 29/7869* (2013.01)

(58) Field of Classification Search  
CPC ............... H01L 29/78; H01L 29/78618; H01L 27/1225; H01L 27/1288; H01L 29/7869; H01L 29/66969  
See application file for complete search history.

(56) References Cited

U.S. PATENT DOCUMENTS

| | | | |
|---|---|---|---|
| 2005/0009248 A1* | 1/2005 | Weng | H01L 51/0021 |
| | | | 438/149 |
| 2011/0220906 A1* | 9/2011 | Huang | H01L 27/1225 |
| | | | 257/72 |
| 2014/0070181 A1 | 3/2014 | Zhang | |

FOREIGN PATENT DOCUMENTS

| | | |
|---|---|---|
| EP | 1 928 038 A2 | 6/2008 |
| WO | 2006/126363 A1 | 11/2006 |
| WO | 2013/127200 A1 | 9/2013 |

OTHER PUBLICATIONS

International Search Report for PCT/EP2014/077087 dated Feb. 20, 2015.

* cited by examiner

*Primary Examiner* — Phuc Dang  
(74) *Attorney, Agent, or Firm* — Sughrue Mion, PLLC (57) ABSTRACT

A transistor device comprising: source and drain conductors connected by a semiconductor channel provided by a layer of semiconductor material formed over the source and drain conductors; and a gate conductor capacitively coupled to the semiconductor channel via a gate dielectric; wherein at least one of the source and drain conductors comprises a multilayer structure in at least one region thereof, the multilayer structure comprising a lower layer and an upper layer, the material of the lower layer being better than the material of the upper layer at injecting charge into the semiconductor material; and the material of the upper layer exhibiting better electrical conductivity than the material of the lower layer.

11 Claims, 6 Drawing Sheets

(51) Int. Cl.
*H01L 29/66* (2006.01)
*H01L 27/12* (2006.01)

SOURCE/DRAIN CONDUCTORS FOR TRANSISTOR DEVICES

CROSS REFERENCE TO RELATED APPLICATIONS

This application is a National Stage of International Application No. PCT/EP2014/077087 filed Dec. 9, 2014, claiming priority based on British Patent Application No. 1321796.3 filed Dec. 10, 2013, the contents of all of which are incorporated herein by reference in their entirety.

A transistor device typically comprises source and drain conductors connected by a semiconductor channel, and a gate conductor capacitively coupled to the semiconductor channel via a gate dielectric.

The operation of a transistor device involves the injection of charge carriers into the semiconductor channel from the source and drain conductors. One technique for facilitating charge injection involves selecting for the source and drain conductors a material having both good electrical conductivity and a work function close to the work function of the semiconductor.

The inventors for the present application have identified the challenge of developing a new technique for facilitating charge injection into the semiconductor channel.

There is hereby provided a transistor device comprising: source and drain conductors connected by a semiconductor channel provided by a layer of semiconductor material formed over the source and drain conductors; and a gate conductor capacitively coupled to the semiconductor channel via a gate dielectric; wherein at least one of the source and drain conductors comprises a multilayer structure in at least one region thereof, the multilayer structure comprising a lower layer and an upper layer, the material of the lower layer being better than the material of the upper layer at injecting charge into the semiconductor material; and the material of the upper layer exhibiting better electrical conductivity than the material of the lower layer.

According to one embodiment, at least an edge portion of the upper surface of the lower layer is selectively uncovered by the upper layer in at least a region where the source and drain conductors are in closest proximity to each other via the semiconductor.

According to one embodiment, the multilayer structure comprises a third layer below the lower layer, which third layer functions to improve the adhesion of the lower layer to an underlying substrate.

According to one embodiment, the gate dielectric is formed over the layer of semiconductor material, and the gate conductor is formed over the gate dielectric.

According to one embodiment, the source and drain conductors are formed over a substrate comprising a support substrate, said gate conductor formed over said support substrate, and said gate dielectric formed over said gate conductor and said support substrate.

According to one embodiment, the transistor device forms part of a transistor array; wherein the source conductor comprises one or more electrode portions in closest proximity to one or more respective drain conductors via the semiconductor, and one or more addressing portions connecting said one or more electrode portions to an edge of the transistor array; and wherein the relative width of said edge region is greater for said one or more electrode regions than for said one or more addressing portions, wherein the relative width is the width of the edge portion as a proportion of the whole width of the lower layer.

According to one embodiment, the upper surface of the lower layer is uncovered by the upper layer across substantially the whole width of the lower layer for said one or more electrode portions.

According to one embodiment, the layer of semiconductor material substantially conforms to the underlying source and drain conductors and the substrate, and has a thickness less than the thickness of the upper layer.

There is also hereby provided a method of forming a transistor device comprising: forming source and drain conductors; forming a semiconductor layer over the source and drain conductors to define a semiconductor channel between the source and drain conductors; providing a gate conductor capacitively coupled to the semiconductor channel via a gate dielectric; wherein at least one of the source and drain conductors comprises a multilayer structure comprising at least an upper layer and a lower layer; and wherein forming the source and drain conductors comprises selectively patterning the upper layer on the lower layer to produce a reduced pattern in the upper layer relative to the lower layer; wherein the lower layer exhibits better charge injection into the semiconductor channel than the upper layer; and the upper layer exhibits better electrical conductivity than the lower layer.

According to one embodiment, selectively patterning the upper layer on the lower layer comprises exposing at least an edge portion of an upper surface of the lower layer for direct contact of said upper surface with the semiconductor layer in at least a region where the source and drain conductors are in closest proximity to each other via the semiconductor.

According to one embodiment, the transistor device forms part of a transistor array; wherein the source conductor comprises one or more electrode portions in closest proximity to one or more respective drain conductors via the semiconductor, and one or more addressing portions connecting said one or more electrode portions to an edge of the transistor array; and wherein the relative width of said edge portion is greater for said one or more electrode regions than for said one or more addressing portions, wherein the relative width is the width of the edge portion as a proportion of the whole width of the lower layer.

According to one embodiment, the upper surface of the lower layer is uncovered by the upper layer across substantially the whole width of the lower layer for said one or more electrode portions.

According to one embodiment, the method further comprises depositing the layer of semiconductor material by a conformal deposition technique over the substrate and patterned conductor layer, and to a thickness less than the thickness of the upper layer.

An example of a technique according to an embodiment of the present invention is described in detail hereunder, by way of example only, with reference to the accompanying drawings, in which:—

Figure 5:
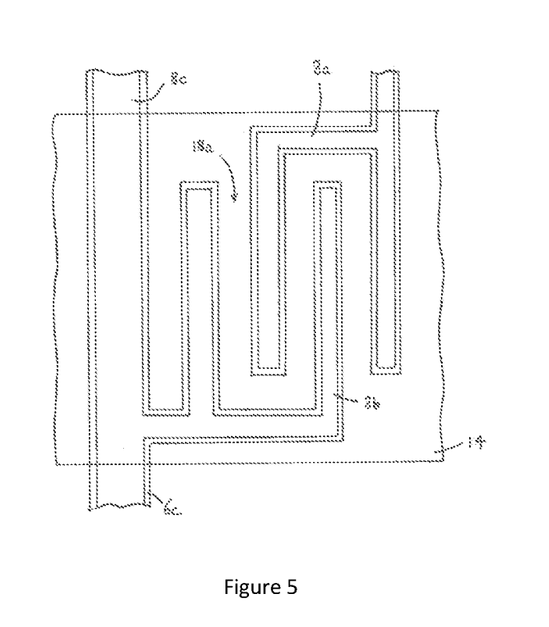
FIG. 5 is a schematic plan view of the source and drain conductors of FIGS. 1 and 2.
Figure 6:
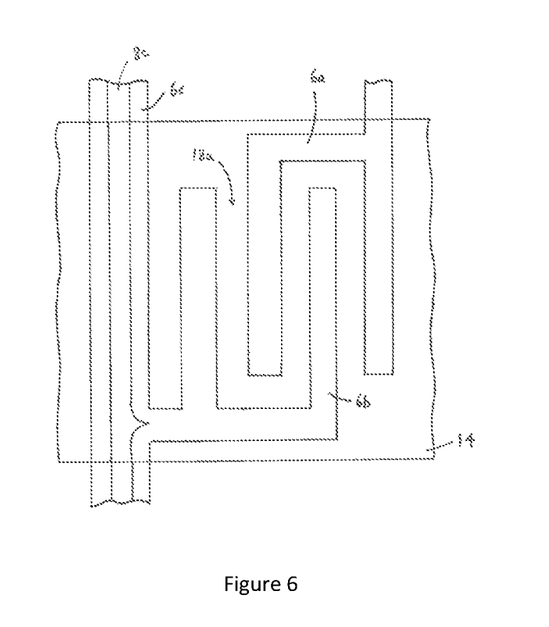
FIG. 6 is a schematic plan view of the source and drain conductors of FIG. 3.

An example of a technique according to the present invention is described below for an example of a transistor having interdigitated source/drain conductors having linear finger structures of the kind shown in FIGS. 5 and 6, but the same technique may also be used for transistors having different architectures for the source/drain conductors such as, for example, an architecture in which a source conductor extending completely around a drain conductor.

Figure 1:
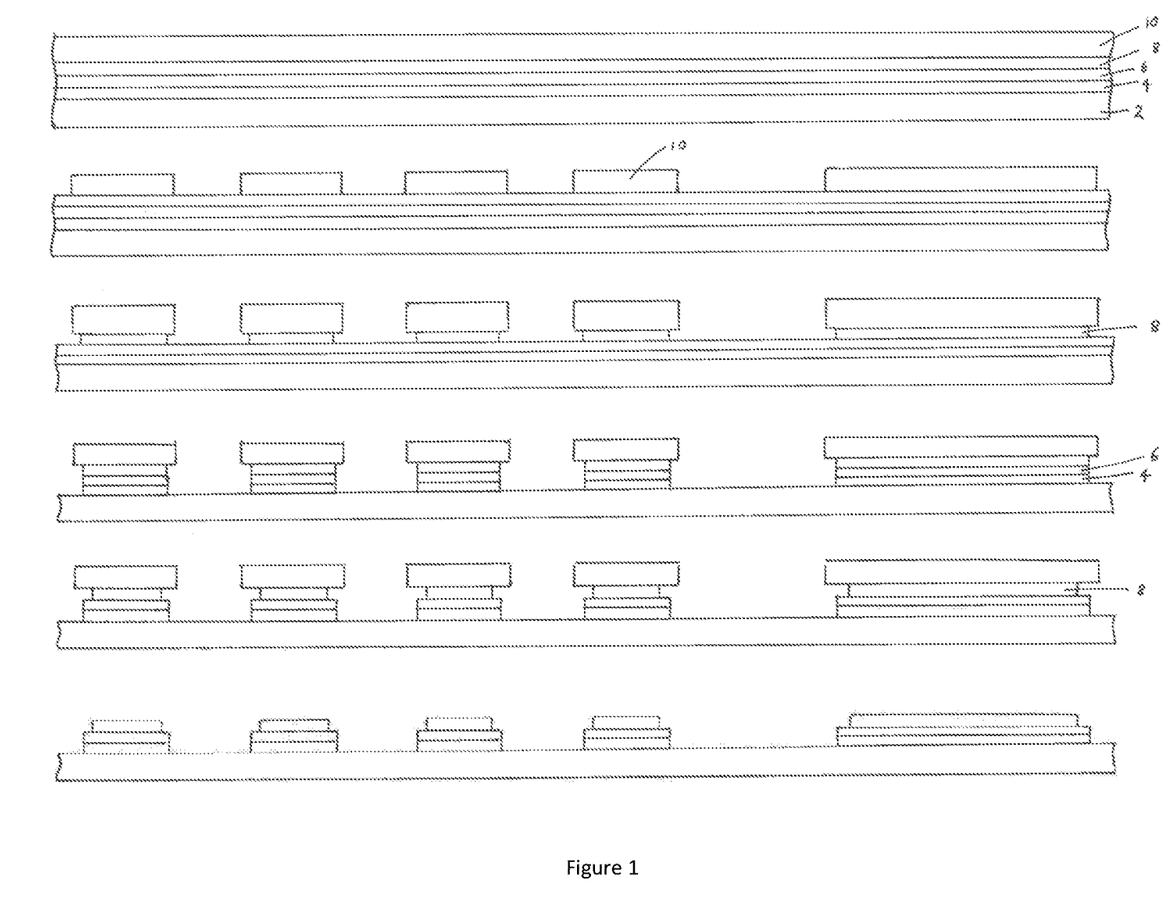
FIG. 1 is a schematic cross-sectional view illustrating an example of a technique for forming source and drain conductors of a transistor.
Figure 2:
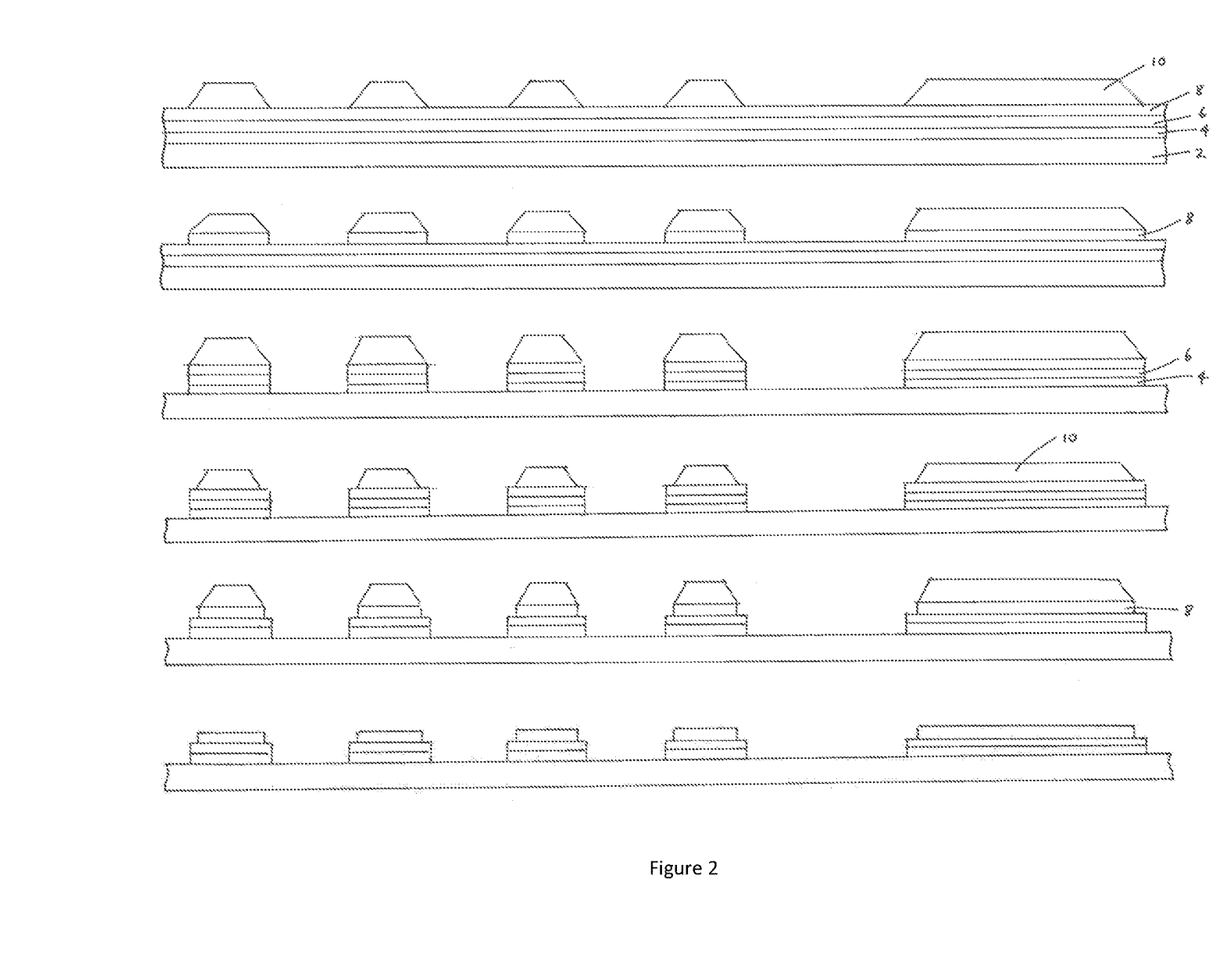
FIG. 2 is a schematic cross-sectional view illustrating another example of a technique for forming source and drain conductors of a transistor.

FIGS. 1 and 2 show only one transistor; but this technique is also applicable to transistor arrays comprising large numbers of transistors such as, for example, a typical pixelated display device comprising more than 1 million pixels each controlled by a respective transistor; or to circuits including one or more transistors such as integrated gate drivers.

A continuous first conductor layer is formed on a substrate 2 by e.g. a vapour deposition technique such as e.g. sputtering. As discussed below, the substrate 2 comprises a support 16, and in the case of producing a bottom-gate transistor also comprises a patterned gate conductor 14 formed over the support 16 and a gate dielectric 12 formed over the gate conductor 14 and the support 16.

As discussed below, the first conductor layer is patterned to define at least source and drain conductors, and a semiconductor layer 18 is either formed directly over the patterned first conductor layer to form semiconductor channel between the source and drain conductors, or via, for example, a self-assembled monolayer of a material that exhibits a work function closer to that of the semiconductor (and may be even higher than that of the semiconductor) to further improve charge injection into the semiconductor.

The first conductor layer has a multilayer structure comprising lower and upper layers 6, 8 of different materials; and an additional bottom layer 4 that functions to increase the adhesion of the lower layer 6 to the substrate 2. The bottom layer 4, lower layer 6 and upper layer 8 are deposited in sequence by e.g. sputtering before any patterning of the multilayer structure. The lower layer 6 comprises a material that is better at injecting charge carriers into the semiconductor 18 than that of the upper layer 8 (e.g. has a work function closer than that of the material of the first layer to the work function of the semiconductor); and the upper layer 8 comprises a material that exhibits better electrical conductivity than that of the lower layer 6. As mentioned below, the bottom layer 4 can be omitted if the material of the lower layer 6 is a material that exhibits sufficiently good adhesion to the substrate 6.

A continuous layer of photoresist material 10 is formed over the first conductor layer. The photoresist layer 10 is patterned according to a photolithographic technique involving: using a mask to irradiate selected portions thereof and change the solubility of those portions in a developer solvent, and then developing the latent image by spraying the developer solvent onto the photoresist layer 10 or immersing the photoresist layer 10 in a bath of the developer solvent. The photoresist material may be a negative photoresist material or a positive photoresist material.

In the example of FIG. 1, the resulting structure is subjected, in order, to (i) wet etching using the patterned photoresist as a mask and using an etchant that selectively etches the upper layer 8, (ii) wet etching using the patterned upper layer 8 as a mask and using an etchant that selectively etches the lower layer 6 and bottom layer 4 or a combination of an etchant that selectively etches the lower layer 6 and an etchant that selectively etches the bottom layer 4; and (iii) further wet etching using the patterned photoresist as a mask and using an etchant that selectively etches the upper layer 8. The etchant used for the further etching (iii) of the upper layer 8 can be an etchant that also etches the bottom layer 4 (but not the lower layer 6), because the adhesion-promoting function of the bottom layer can still be achieved with some under-etching of the bottom layer 4 below the lower layer 6.

A non-limiting example of a combination of materials for the bottom, lower and upper layers includes: a molybdenum-tantalum alloy for the bottom layer; gold for the lower layer 6 and aluminium, silver or copper for the upper layer 8. A hydrofluoric/nitric acid mixture can be used to etch aluminium, silver, copper and molybdenum-tantalum alloys without any substantial etching of the gold; and iodine can be used to etch gold without any substantial etching of aluminium, silver, copper or molybdenum-tantalum alloys.

According to one variation of the above-described example patterning technique, the further wet etching (iii) of the upper layer 8 can be preceded by some reduction of the patterned photoresist by e.g. plasma etching (after etching step (ii)) to expose upper surface of edge portions of the upper layer 8. The photolithographic patterning of the photoresist is done such that the patterned photoresist exhibits a thickness profile according to which the thickness of the photoresist decreases towards the edges of the remaining portions of the photoresist, such that later removal of a surface thickness of the patterned photoresist by e.g. plasma etching exposes the upper surface of edge portions of the upper layer 8.

Finally, the whole of the remaining photoresist is stripped away. The resulting structure comprises a patterned conductor layer defining source and drain conductors each comprising a multilayer structure in which the upper layer remains on a central portion of the lower layer, and the upper surface of the perimeter portion of the patterned lower layer 6 is exposed for direct contact with the semiconductor 18, or for contact with the semiconductor via, for example, a self-assembled monolayer to further improve charge injection.

The inventors for the present application have found that good transistor performance can be achieved even when exposing a relatively small edge portion (e.g. about 200-1000 nm from the edge of the patterned lower layer 6) of the upper surface of the patterned lower layer 6, but it is also possible to expose the whole of the upper surface of the patterned lower layer in some regions, as discussed below and illustrated in FIGS. 3 and 6. In more detail, the inventors for the present application have found that even when the upper surface of interdigitated portions of source and drain conductors has the same composition across the width of those interdigitated portions, and the semiconductor material is also formed over the whole width of those portions, there is in fact little contribution to the performance of the transistor from charge injection into the semiconductor from central regions of those interdigitated portions.

In the example of FIG. 2, the same kind of end result is achieved using a dry etching process. In the example of FIG. 2, the photoresist layer 10 is patterned so as to define a thickness profile in the remaining portions of the photoresist layer (after development) in which the thickness of the photoresist decreases towards the edges of the remaining portions of the photoresist. The resulting structure is subjected to (i) dry etching using the patterned photoresist as a mask, and using an etchant that selectively etches the upper layer 8, and (ii) dry etching using the patterned upper layer 8 as a mask and using an etchant(s) that selectively etches the lower layer 6 (and the bottom layer 4, if used). The patterned photoresist layer 10 is then subjected to a reduction process such as e.g. plasma ashing to remove a surface portion of the patterned photoresist layer. Because of the above-mentioned thickness profile of the patterned photoresist layer 10, this reduction process serves to selectively expose the upper surface of edge portions of the patterned first conductor layer (whilst leaving photoresist material on a central portion of the patterned first conductor layer). The resulting structure is subjected to further dry etching using the reduced photoresist layer 10 as a mask and using an etchant that selectively etches the upper layer 8.

For the example of a 2-dimensional array of transistors, the patterned first conductor layer defines an array of source conductors each providing the source electrodes for a respective row of transistors, and connected to a respective terminal of one or more source driver chips. Each source conductor comprises addressing portions that are not adjacent any drain conductor or relatively distant from any adjacent drain conductor, but which function to create conductive connections between the portions of the source conductor in close proximity to the drain conductors of the respective row of transistors and a respective terminal of one or more source driver chips at one or more edge of the transistor array.

In the example illustrated in the accompanying drawings, these addressing portions comprise substantially linear structures (6c, 8c), and the portions (6b, 8b) of the source conductor that provide the source electrodes for the transistors associated with the source conductor branch off these substantially linear structures. In this example, the substantially linear structures of the source conductor have a greater width than the branched portions of the source conductor. The example illustrated in FIG. 3 is the same as that illustrated in FIG. 2, except that the photoresist reduction process (after initial etching of the upper, lower and bottom layers 4, 6, 8) is performed to the extent that substantially the whole of the photoresist layer is removed from the branched portions of the source conductor, whilst leaving photoresist material on the central portions of the substantially linear structures. The subsequent dry etching of the upper layer (using an etchant that selectively etches the upper layer 8 and using the reduced photoresist layer 10 as a mask) removes substantially all of the upper layer 8 from the branched portions whilst leaving the upper layer 8 on central portions of the substantially linear structures. Removing all of the upper layer 8 from the branched portions can also better facilitate the formation of a semiconductor layer of good thickness uniformity over the exposed upper surface of the lower layer 6 of the branched portions; whilst retaining part of the upper layer 8 on most of the length of the source conductors facilitates the achievement of good electrical conductivity.

After the patterning of the source and drain conductors is completed, a semiconductor layer 18 is formed over the patterned first conductor layer (either for direct contact with the patterned first conductor layer or via, for example, a self-assembled monolayer to further improve charge injection) to form semiconductor channels 18a between the source and drain conductors. In this example, the semiconductor material is deposited by a substantially conformal technique, and is deposited to a thickness smaller than the thickness of the upper layer 8, but the semiconductor material can also be deposited to larger thicknesses.

Figure 3:
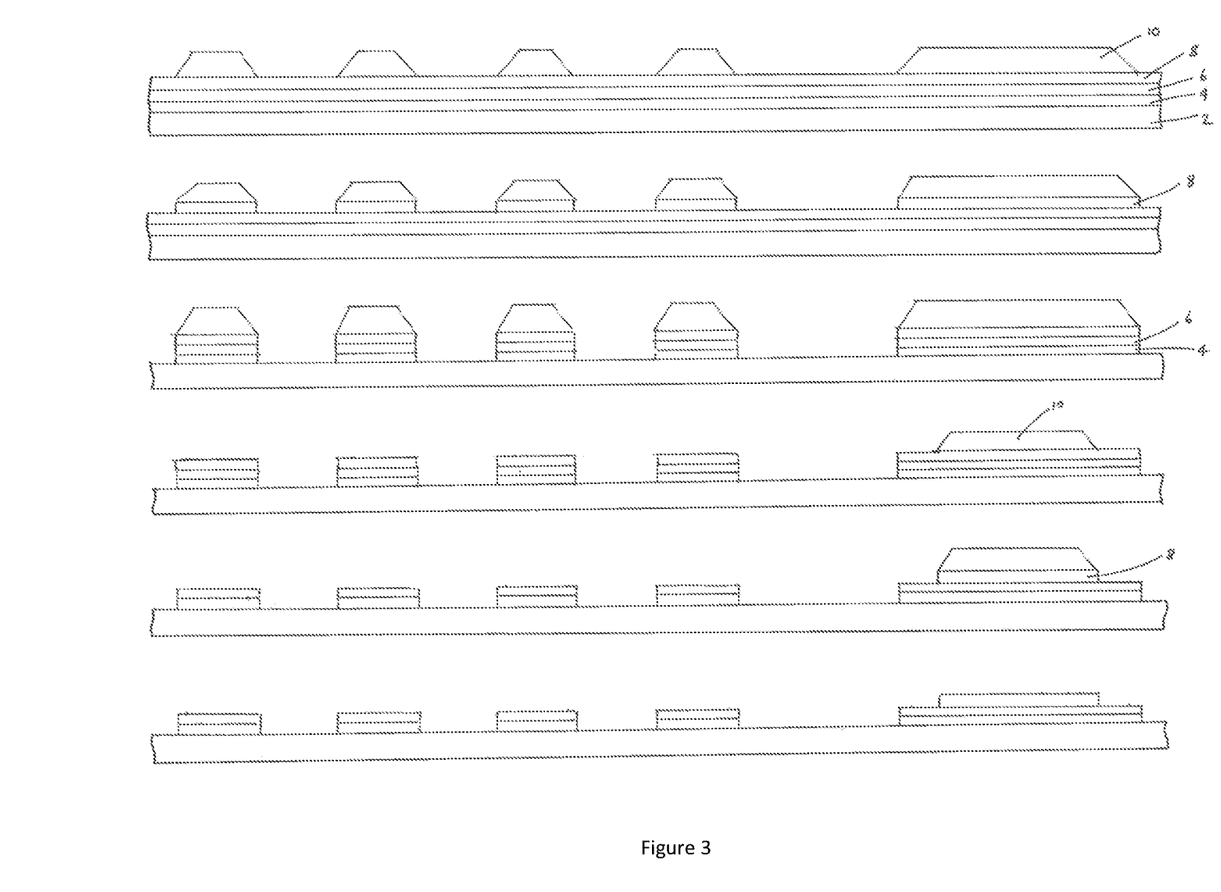
FIG. 3 is a schematic cross-sectional view illustrating yet another example of a technique for forming source and drain conductors of a transistor.
Figure 4:
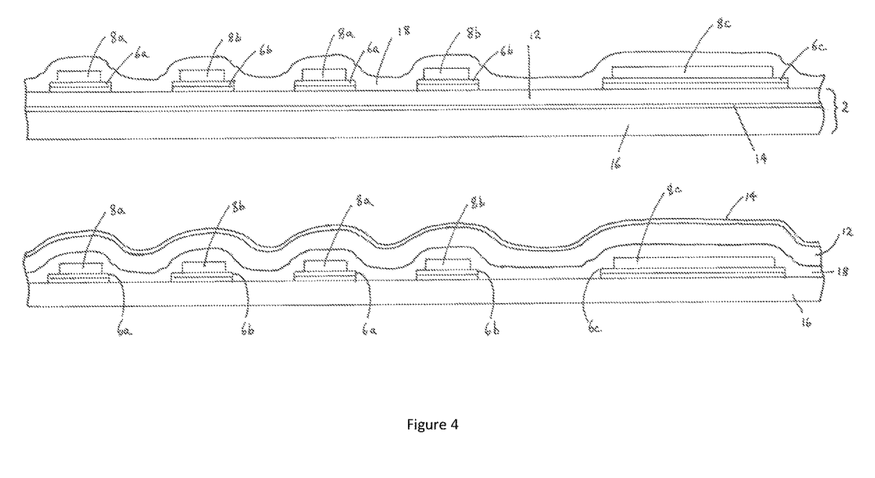
FIG. 4 is a schematic cross-sectional view illustrating top-gate and bottom-gate transistors.

The examples of techniques illustrated in FIGS. 1 to 3 involve the use of an etchant that selectively etches the lower layer 6 without any substantial etching of the upper layer 8. Another example of a technique to achieve the same end result without the use of such a selective etchant involves depositing and patterning the lower layer 6 (and bottom layer 4, if used), before depositing and patterning the upper layer 8 using a mask carefully aligned to the pattern of the lower layer 6 and an etchant that selectively etches the upper layer 8 without any substantial etching of the lower layer 6. As mentioned above, the adhesion-promoting function of the bottom layer 4 (if used) is also achieved even with some etching of the bottom layer 4 (if used) by the etchant used for etching the upper layer 8. In the case of producing a top-gate transistor (or top-gate transistor array), a gate dielectric layer is formed over the semiconductor layer 18 and the patterned first conductor layer 4, and a further conductor layer is formed over the gate dielectric layer and patterned to form one or more gate conductors 14. In the example of producing a 2D ordered array of transistors, the further conductor layer is patterned by e.g. laser ablation into an array of gate conductors, each gate conductor providing the gate electrodes for a respective column of transistors.

In the case of a top-gate transistor having a relatively thin semiconductor layer extending over the lower layer 6 but having a thickness smaller than that of the upper layer 8, one additional advantage identified by the inventors of using a multilayer structure comprising a lower, charge injection layer having at least an edge portion of its upper surface exposed from below an upper highly-conductive layer (compared to e.g. forming a thin layer of charge-injection material over pre-pattered source/drain conductors), is that the whole of the surface area of the edge portion of the exposed upper surface of the charge-injection layer is relatively close to the substrate on which the semiconductor 18 is formed, and the distance over which charge carriers injected into the semiconductor 18 have to travel in a direction against the electric gate field is relatively short. This can provide an improvement in TFT performance particularly in transistors which are operated at relatively low source-drain voltages.

In the case of producing a bottom-gate transistor (or bottom-gate transistor array), the substrate 2 comprises the gate dielectric and the gate conductor(s). A gate conductor layer is formed on a support substrate 16, and then patterned into a gate conductor or array of gate conductors 14. A gate dielectric layer 12 is formed over the patterned gate conductor layer and the support substrate 16. The source/drain conductor layer is formed on the upper surface of the gate dielectric layer 12.

The semiconductor layer 18 and/or the gate dielectric layer 12 may comprise one or more materials and/or one or more sub-layers.

The lower layer 6 comprises material that has a work function that more closely matches the work function of the semiconductor material than the material of the upper layer. The material of the upper layer exhibits better electrical conductivity than the material of the lower layer. The lower layer may, for example, comprise a metal, metal alloy or ceramic material having a work function that more closely matches the work function of the semiconductor material than the material of the upper layer. The upper layer 8 may, for example, comprise a metal or metal alloy having a better electrical conductivity than the material of the lower layer 6. Some examples of materials that have relatively high work functions comparable to those of some semiconductor materials include: noble metals such as gold, palladium, platinum and silver; and metals with a thin oxide surface layer such as $MoO_3$, indium-tin oxide (ITO) and non-stoichiometric titanium oxide (TiO$_x$). Some examples of materials having good electrical conductivity include aluminium, copper and silver.

Relatively small thicknesses for the lower layer 6 can be optimal for maximising the performance of the transistor. In one example, the lower layer has a thickness of 20-70 nm.

The bottom layer 4 is not required if the adhesion of the lower layer 6 to the substrate 2 is sufficient without this bottom layer 4. The bottom layer 4 may, for example, comprise a metal or metal alloy that adheres better to the upper surface of the substrate 2 than the material of the lower layer would adhere to the upper surface of the substrate 2. Examples of some metallic materials that exhibit relatively good adhesion to organic substrates are titanium, chrome, molybdenum and alloys thereof. The adhesion-promoting function of this bottom layer 4 can be achieved with a layer thickness as small as a few nanometers. In one example, the thickness of this layer is no more than 20 nm.

In one example, the support substrate 16 comprises a plastic film and an organic planarisation layer on the upper surface of the plastic film.

Figure 7:
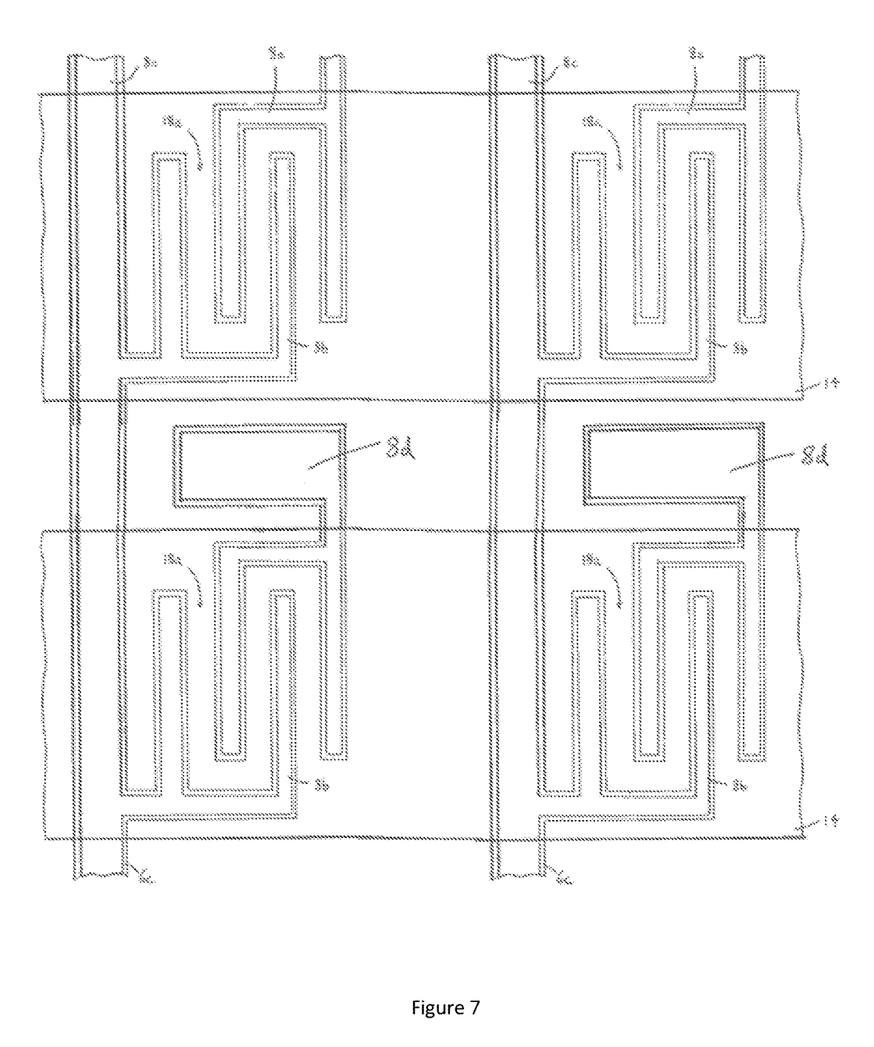
FIG. 7 is a schematic plan view illustrating an example of an array of transistors of the kind illustrated in FIGS. 1, 2 and 5.

In the case of the example of producing a transistor array for a pixelated display device, the above-mentioned steps are supplemented by: forming a further insulating layer over the resulting structure, forming through holes down to a drain pad portion (8*d* in FIG. 7) of each drain conductor; depositing a pixel conductor material into the through holes and over the further insulating layer; and then patterning the pixel conductor layer to define an array of pixel conductors each conductively connected to a respective drain conductor.

In one example, the device includes further insulator and conductor layers between the pixel conductor layer and the underlying conductor layers (e.g. between the pixel conductor layer and the patterned gate conductor layer in the case of a bottom-gate transistor (array). For example, the device may include a screening, conductor layer which overlaps with the whole of the combined area of the pixel conductors and the whole of the combined area between the pixel conductors, except for through holes defined in the screening layer to accommodate the interlayer connects between the pixel conductors and the drain conductors. Such screening layer can function to reduce unpredictable capacitive coupling between the overlying pixel conductors and underlying conductors.

One example of a method of operating a transistor array involves: driving the gate conductors sequentially at "on" voltages (whilst all other gate conductors are at "off" voltages), which "on" voltage increases the conductivity of the semiconductor channels of the respective column of transistors; and applying respective voltages to the source conductors to achieve the desired electric potential at the drain conductors (and therefore the pixel electrodes) of the transistors associated with the "on" gate conductor. Each transistor is associated with a respective unique combination of source and gate conductors, and the electric potential at the drain conductor of any transistor can thus be controlled independently of all other transistors in the array.

The drawings schematically illustrate the example of an architecture in which the addressing portion (6*c*, 8*c*) of the source conductor extends in a direction substantially parallel to the interdigitated finger portions of the source conductor (6*b*, 8*b*) that are closest to the drain conductor (6*a*, 8*a*); but the above-described technique is also applicable to other architectures such as, for example, one in which the addressing portion of the source conductor extends in a direction substantially perpendicular to the interdigitated finger portions of the source conductor.

In addition to the modifications explicitly mentioned above, it will be evident to a person skilled in the art that various other modifications of the described embodiment may be made within the scope of the invention.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features.

The invention claimed is:

1. A transistor device comprising: source and drain conductors connected by a semiconductor channel provided by a layer of semiconductor material formed over the source and drain conductors; and a gate conductor capacitively coupled to the semiconductor channel via a gate dielectric; wherein at least one of the source and drain conductors comprises a multilayer structure in at least one region thereof, the multilayer structure comprising a lower layer and an upper layer, the material of the lower layer being better than the material of the upper layer at injecting charge into the semiconductor material; and the material of the upper layer exhibiting better electrical conductivity than the material of the lower layer; wherein the transistor device forms part of a transistor array; wherein the source conductor comprises one or more electrode portions in closest proximity to one or more respective drain conductors via the semiconductor material, and one or more addressing portions connecting said one or more electrode portions to an edge of the transistor array; wherein at least an edge portion of the upper surface of the lower layer is selectively uncovered by the upper layer in at least a region where the source and drain conductors are in closest proximity to each other via the semiconductor material; wherein said upper layer is retained in both said electrode portions and said addressing portions; and wherein the relative width of said edge portion is greater for said one or more electrode portions than for said one or more addressing portions, wherein the relative width is the width of the edge portion as a proportion of the whole width of the lower layer.

2. The transistor device according to claim 1, wherein the multilayer structure comprises a third layer below the lower layer, which third layer functions to improve the adhesion of the lower layer to an underlying substrate.

3. The transistor device according to claim 1, wherein the gate dielectric is formed over the layer of semiconductor material, and the gate conductor is formed over the gate dielectric.

4. The transistor device according to claim 1, wherein the source and drain conductors are formed over a substrate comprising a support substrate, said gate conductor formed over said support substrate, and said gate dielectric formed over said gate conductor and said support substrate.

5. The transistor device according to claim 1, wherein the layer of semiconductor material substantially conforms to the underlying source and drain conductors and the substrate, and has a thickness less than the thickness of the upper layer.

6. A method of forming a transistor device comprising: forming source and drain conductors; forming a semiconductor layer over the source and drain conductors to define a semiconductor channel between the source and drain conductors; providing a gate conductor capacitively coupled to the semiconductor channel via a gate dielectric; wherein at least one of the source and drain conductors comprises a multilayer structure comprising at least an upper layer and a lower layer; and wherein forming the source and drain conductors comprises forming a mask over the multilayer structure; using the mask to remove selected portions of both said upper and lower layers of the multilayer structure, and without reducing the mask, selectively removing edge portions of said upper layer to produce a reduced pattern in the upper layer relative to the lower layer; wherein the lower layer exhibits better charge injection into the semiconductor channel than the upper layer; and the upper layer exhibits better electrical conductivity than the lower layer.

7. The method according to claim 6, wherein selectively patterning the upper layer on the lower layer comprises exposing at least an edge portion of an upper surface of the lower layer for direct contact of said upper surface with the semiconductor layer in at least a region where the source and drain conductors are in closest proximity to each other via the semiconductor.

8. The method according to claim 7, wherein the transistor device forms part of a transistor array; wherein the source conductor comprises one or more electrode portions in closest proximity to one or more respective drain conductors via the semiconductor, and one or more addressing portions connecting said one or more electrode portions to an edge of the transistor array; and wherein the relative width of said edge portion is greater for said one or more electrode regions than for said one or more addressing portions, wherein the relative width is the width of the edge portion as a proportion of the whole width of the lower layer.

9. The method according to claim 8, wherein the upper surface of the lower layer is uncovered by the upper layer across substantially the whole width of the lower layer for said one or more electrode portions.

10. The method according to claim 6, comprising depositing the semiconductor layer by a conformal deposition technique over the substrate and patterned conductor layer, and to a thickness less than the thickness of the upper layer.

11. A method of forming a transistor device comprising: forming source and drain conductors; forming a semiconductor layer over the source and drain conductors to define a semiconductor channel between the source and drain conductors; providing a gate conductor capacitively coupled to the semiconductor channel via a gate dielectric; wherein at least one of the source and drain conductors comprises a multilayer structure comprising at least an upper layer and a lower layer; and wherein forming the source and drain conductors comprises forming a patterned mask over the multilayer structure, which patterned mask has the same thickness in at least all regions except edge portions of said patterned mask; using the mask to remove selected portions of both said upper and lower layers of the multilayer structure; thereafter removing a surface thickness of the patterned mask; and thereafter using the mask to selectively remove edge portions of said upper layer, to produce a reduced pattern in the upper layer relative to the lower layer; wherein the lower layer exhibits better charge injection into the semiconductor channel than the upper layer; and the upper layer exhibits better electrical conductivity than the lower layer.

* * * * *